US006101099A

United States Patent [19]

Olsson

[11] Patent Number: 6,101,099

[45] Date of Patent: Aug. 8, 2000

[54] METHOD AND DEVICE FOR CONNECTING ELECTRICAL COMPONENTS TO PRINTED CIRCUIT BOARDS

[75] Inventor: Christer Olsson, Lidingö , Sweden

[73] Assignee: Telefonaktiebolaget LM Ericsson, Stockholm, Sweden

[21] Appl. No.: 08/993,777

[22] Filed: Dec. 18, 1997

[30] Foreign Application Priority Data

Dec. 20, 1996 [SE] Sweden ................................ 9604703

[51] Int. Cl.[7] ................................................ H05K 7/02

[52] U.S. Cl. ......................... 361/761; 361/767; 361/772; 361/773; 361/807; 257/735; 257/728; 257/275; 257/784; 174/52.2; 174/260; 174/255

[58] Field of Search .................................. 361/761, 767, 361/772, 773, 775, 813, 807, 808, 809; 257/735, 728, 275, 276, 773, 784; 174/52.1, 260, 255

[56] References Cited

U.S. PATENT DOCUMENTS

| | | | |
|---|---|---|---|
| 4,777,564 | 10/1988 | Derfiny et al. | 361/405 |
| 4,904,414 | 2/1990 | Peltz et al. | 252/514 |
| 4,991,059 | 2/1991 | Kiyose | 361/405 |
| 4,992,851 | 2/1991 | Platzoeder et al. | 357/74 |
| 5,028,741 | 7/1991 | Sanders et al. | 174/52.2 |
| 5,075,759 | 12/1991 | Moline | 257/692 |
| 5,241,134 | 8/1993 | Yoo | 174/94 |
| 5,347,160 | 9/1994 | Sutrina | 257/698 |
| 5,387,888 | 2/1995 | Eda et al. | 333/247 |
| 5,395,876 | 3/1995 | Frentzel et al. | 524/440 |
| 5,521,406 | 5/1996 | Tserng et al. | 257/276 |
| 5,532,506 | 7/1996 | Tserng | 257/276 |

FOREIGN PATENT DOCUMENTS

| | | |
|---|---|---|
| 0 258 444 | 3/1988 | European Pat. Off. . |
| 0 658 074 | 6/1995 | European Pat. Off. . |
| 0 696 159 | 2/1996 | European Pat. Off. . |
| 94/14193 | 6/1994 | WIPO . |

*Primary Examiner*—Leo P. Picard
*Assistant Examiner*—David Foster
*Attorney, Agent, or Firm*—Burns, Doane, Swecker & Mathis, L.L.P.

[57] ABSTRACT

The present invention relates to a device and a method for electrical and mechanical connection of an electric high-power component (111) which transmits high-frequency electrical signals to conductors (120) on a circuit board (119). The component comprises connections (114) projecting over the circuit board and which are soldered to the conductors (120) on the circuit board (119) with a solder material (112) which essentially lacks grain growth. The component is subject to repeated temperature changes which leads to stresses on the connection between the connections (114) and the conductors (120). The length of the connections is selected depending on a predetermined threshold value for the highest acceptable attenuation which the high-frequency electrical signal is subject to when passing through the electrical high-power component via the connections. The connections can be shaped so that they comprise a bent part with a bending which is determined in dependence of said threshold value.

37 Claims, 3 Drawing Sheets

114
0.7mm
v=30°
113
116
112
120a

2mm
v=5°
0.2mm
113
116
114
112
120a

METHOD AND DEVICE FOR CONNECTING ELECTRICAL COMPONENTS TO PRINTED CIRCUIT BOARDS

FIELD OF THE INVENTION

The present invention relates to a method and a device for connecting an electrical component to a circuit board. More closely, it relates to the electrical and mechanical connection of a high-power component which transmits high frequency electrical signals to electrically conducting conductor paths on a circuit board.

STATE OF THE ART

The connecting of electrical components to conductor paths on circuit boards normally takes place through soldering. The components can have projecting connections, so-called legs, or some other type of connection which are soldered to some kind of contact surface which is connected to the conductor paths on the circuit board.

The electrical components can, during use, heat up and be subject to stresses, such as temperature changes or mechanical influences. The component, the component legs and the circuit board have different coefficients of expansion, whereby the soldered joint is subject to stresses during heating and cooling. Therefore electrical components are normally designed so that they rest on vertically bent legs which permit the components to move. When the component is heated up and expands, the forces produced then can partially be absorbed by the resilient legs.

U.S. Pat. Nos. 4,777,564 A, 5,241,134 A and 4,991,059 A describe different embodiments of vertically mounted and bent legs for electrical components.

Not all electrical components can, however, be designed with resilient legs. High-power components, such as high-power transistors develop such high power losses that the temperature increase becomes considerable during operation. Such components are therefore normally mounted sunken in a hole in the circuit board in contact with a cooling flange in order that sufficient cooling is obtained. An example of such components is high-power transistors which amplify high-frequency electrical signals in base stations in a mobile communication system.

The design of the legs influences the signal quality of the high-frequency signals to a great extent. If the legs are made too long or too bent, the power losses increase in the transistor stage which lowers the amplification of the transistor. The longer and the more numerous the bends are, the more narrow-band the transistor stage becomes, at the same time as its tolerance sensitivity increases. If the losses become so great that they encrouch on the amplification, it means that the signal strength is attenuated. In order to avoid this, the legs should be straight, relatively short and arranged projecting horizontally from the transistor.

A disadvantage of today's soldered joints on high-power components is that the soldered joint fatigues and eventually cracks when it is subject to extreme stresses during repeated temperature changes. These temperature changes give rise to cyclic loading of the legs, so-called thermal fatigue.

For practical reasons such component legs are furthermore normally soldered manually, wherefore the quality of the soldered joints can vary. A soldering material which is normally used during soldering of high-power components is the alloy 62%Sn+36%Pb+2%Ag.

DESCRIPTION OF THE INVENTION

The present invention tackles a problem of how high-power components which transmit high-frequency electrical signals are to be connected electrically and mechanically to electrical conductors on a circuit board.

A further problem is how a connection arrangement between high-power components and conductors on the circuit board should be designed so that it holds when subject to large, repeated temperature changes.

An object of the present invention is consequently to connect high-power components, which amplify high-frequency electrical signals, to conductors on circuit boards, and to design the connection arrangement between the high-power component and conductors on the circuit board, so that it does not break when subject to large, repeated temperature changes.

The problems are solved by using a solder which essentially lacks grain growth in order to connect component legs to conductors on the circuit board, in combination with selecting the length and shape of the component legs depending on a predetermined threshold value for the signal attenuation for the electrical high-frequency signal.

In more detail, the problem is solved through electrical connections, so-called legs, which project horizontally from the component, being connected to conductors on the circuit board by soldering with a solder which essentially lacks grain growth within a predetermined temperature interval. A threshold value for the highest acceptable signal attenuation of the signal strength for the high-frequency electrical signal is determined. The component legs are shaped, according to a advantageous embodiment, so that they are as long as possible without the resulting signal attenuation being greater than the threshold level. According to one embodiment the component legs are bent, wherein the maximal bending is as large as the threshold level for the signal attenuation permits.

An advantage of the invention is that the length of life for the connection between the legs and the conductors increases, which results in a lower risk of electrical breakdown.

The invention will now be described more closely with the help of preferred embodiments and with reference to the appended drawings.

PREFERRED EMBODIMENTS

Figure 1A:
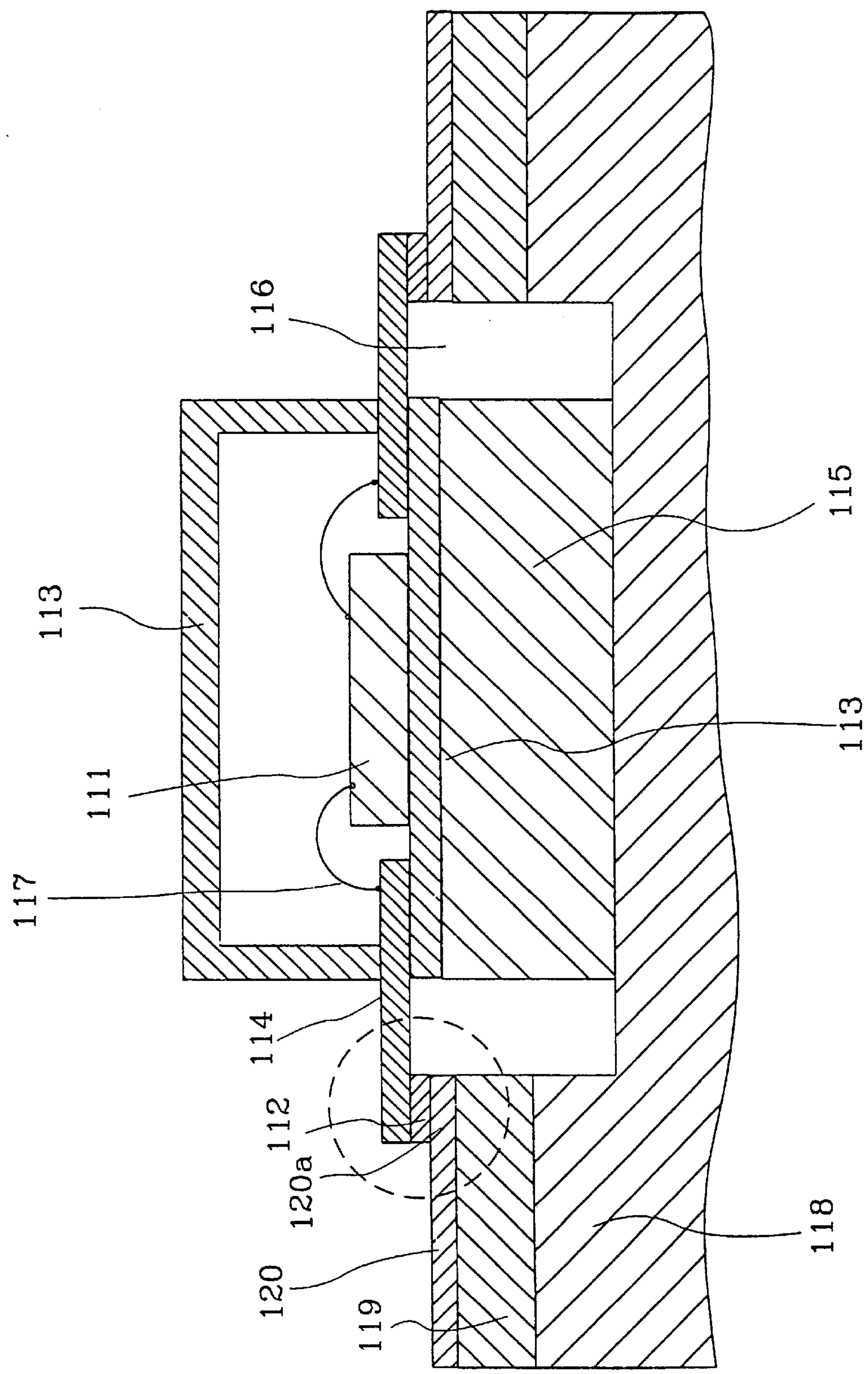
FIG. 1*a* shows a cross-section of a high-power transistor which is mounted on a circuit board.
Figure 1B:
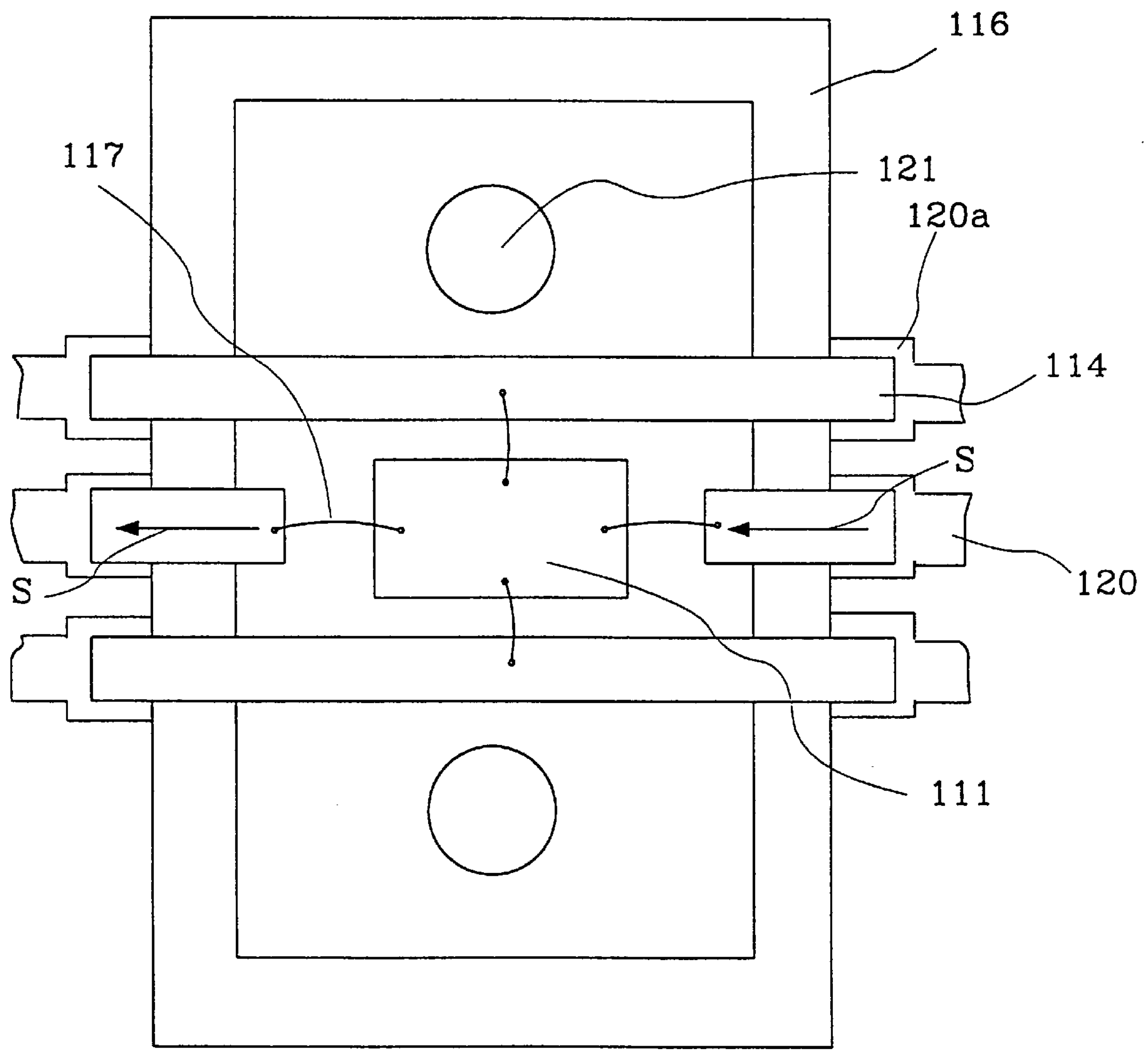
FIG. 1*b* shows a view of the arrangement seen directly from above.

FIG. 1*a* shows a cross-section of a high-power transistor 111 which is mounted on a circuit board 119. FIG. 1*b* shows the device in the unencapsulated state seen from straight above. The figures are not to scale. The high-power transistor 111 is a piece of silicon which is soldered into the bottom of a ceramic capsule 113. The transistor connections 114 project horizontally from the capsule 113. They are electrically connected to the transistor, which in FIG. 1*a* is illustrated with so-called bonding wires 117 from the respective connections to the transistor. The connections 114 will be called "legs" in the rest of the description.

The bottom surface of the capsule 113 rests on a cooling flange 115 which is sunken in a hole 116 in the circuit board

119. The flange is attached to a framework 118 by means of screws in holes 121. The circuit board is fastened to the framework 118.

The legs 114 are intended, by means of some electrically conducting fastening material 112, to be connected electrically and mechanically to the contact surfaces 120*a* on the circuit board. According to the prior art the fastening material is often a soldering material. Arranged on the circuit board 119 are electrical contacts in the form of conductor paths 120 and the contact surfaces 120*a* are part of the conductors. Between the legs and the contact surfaces the fastening material 112 according to the prior art is a soldered joint.

The region of the construction which the invention most closely treats is marked in FIG. 1*a* by a dashed circle. This region comprises the component legs 114, the contact surfaces 120*a* and the fastening material 112 between them.

The high-power transistors can be found, for example, in the radio part of a base station. In such a high-power transistor, power losses of the order of 100 W can be developed which is approximately 100 times greater than the power which is developed by other standard components in the base station. This extremely high power gives rise to high temperature increases in the high-power transistor.

The mounting of high-power transistors as described above in connection with FIGS. 1*a* and 1*b* is different, as mentioned earlier, from the mounting of other electrical components in that the legs of the transistor project horizontally parallel with the surface of the circuit board. As mentioned earlier, the signal quality of the electrical signal, during the transmission of high-frequency electrical signals S, is influenced if the transistor legs are too long or are bent.

The different materials in the transistor, the circuit board and the cooling flange have different coefficients of heat expansion. The circuit board material has a higher coefficient of heat expansion than the legs of the transistor. During increases of temperature of the component and its surroundings the different materials therefore expand by different amounts. The conductor paths are also warmed up by the high radio frequencies and the powerful currents which pass via the conductor paths in connection to the high-power transistor. The repeated temperature changes which follow from the transistor alternatively being in operation and out of operation lead to the connections between the transistor legs and the contact surfaces being subject to cyclic torsion and tension forces. The connections between the legs 114 and the contact surface 120*a* are subject therefore to thermal fatigue.

During the temperature changes crystals, or grains, are formed in the solder. The grains grow for each repeated temperature change, whereby the solder becomes brittle. After a sufficiently long time the grains have grown so much that they let go of each other, whereby the solder falls apart and begins to crack. This phenomenon is called "creeping". The crack formation begins nearest to the transistor and the crack propagates outwards towards the end of the leg. When it reaches the end of the leg, an electrical breakdown occurs. The grain growth depends on several factors, e.g. the solder temperature and the cooling time, and the temperature of the surroundings.

The crack growth furthermore depends on the height and length of the soldered joint. A high soldered joint is more flexible and fatigues more slowly, wherefore it takes a longer time to initiate a crack. A long soldered joint results in that it takes a longer time for an already initiated crack to cause an electrical breakdown.

Tests have been made to find a better and more durable connection, or connection arrangement, than today's solution. The term connection arrangement here comprises a combination of contact surface, transistor legs and between these an electrically conducting fastening material which electrically and mechanically joins together the transistor legs and the contact surface. The factors which influence the durability of the connection arrangement are mainly the grain growth of the solder in the actual temperature interval, which in the present case can be on the order of a 125° C. variation in temperature. By way of example, the temperature interval utilized in development of at least one embodiment of the present invention is between 5° C. and 130° C., the length of the component legs and their shape.

Other influencing factors are the temperature of the surroundings and the leg material. Usually the leg material is copper (Cu) and an alloy with the composition 42%Ni+58%/Fe, usually called "Alloy42", and they can have different surface treatments, such as gold or tinning.

According to the invention a solder is chosen which essentially lacks grain growth for the temperatures which the transistor can be imagined to be subject to. An example of a conceivable solder is a gold/tin solder containing 80%Au+20%Sn which completely lacks grain growth at the temperature which are actual, $5°\ C. < T < 130°\ C.$ Another example is a solder containing 25%Sn+62%Pb+3%Ag+10%Sb. This solder has extremely slow growth of small grains in the actual temperature interval.

The length and height of the soldered joint influences the durability of the connection arrangement. The longer the legs, the longer the soldered joint can be and the longer the distance a crack must travel before the electrical breakdown occurs. The higher the soldered joint, the longer time it takes before the soldered joint is so brittle that a crack is initiated.

As mentioned earlier, the power losses in the transistor are influenced by the length of the legs. If the legs are selected too long, the signal quality of the electrical high-frequency signal is deteriorated. The signal strength is attenuated and too large attenuation cannot be accepted.

A measure of how much the signal strength is attenuated is obtained if the quotient $P_{in}/P_{out}$ between the signal strength $P_{in}$ to one leg and the signal strength $P_{out}$ of the transistor is formed. The attenuation can be expressed in decibels.

According to one embodiment of the invention a threshold level for the attenuation $P_{in}/P_{out}$ is decided which gives the highest tolerated change of the signal strength. According to one embodiment of the invention an attenuation of 0.5 dB is tolerated. If the signal is attenuated more, the loss in the transistor stage is considered to be so large that it encroaches on the amplification for the whole transistor stage, which cannot be accepted. Subsequently it is calculated which maximal length the legs can have without the chosen threshold value being exceeded.

The signal attenuation is dependent on the frequency. This means that the calculated maximal length of the legs becomes longer for a lower frequency than for a higher frequency, at a certain threshold value. The longer the legs are, the larger the fastening surface for the adhesive, but for practical reasons the legs cannot be too long. A check must therefore be performed after the calculation of the maximal length of the legs. If it shows that the legs cannot be made as long as the calculated maximal length, the legs are chosen to be shorter than the maximal length, but as long as is practically possible.

According to an advantageous embodiment of the invention the length of the legs is chosen to be as long as the calculated maximal leg length.

The flexibility or rigidity of the legs influences the durability of the soldered joint. A bent leg can yield somewhat during extension and contraction of the different materials. A bend on the leg also results in that the soldered joint becomes thicker under the bend, whereby the crack growth is retarded.

As mentioned earlier the legs should be straight because bent legs lead to changes of the signal quality of the electrical high-frequency signal. By bend it is meant displacement vertically upwards or downwards, relative to the circuit board.

During experiments it was shown that a leg designed with a bent part with a relatively small bending results in that the tolerance to stress increases. The bending is limited by the earlier determined threshold value for the highest permitted attenuation.

Figure 2A:
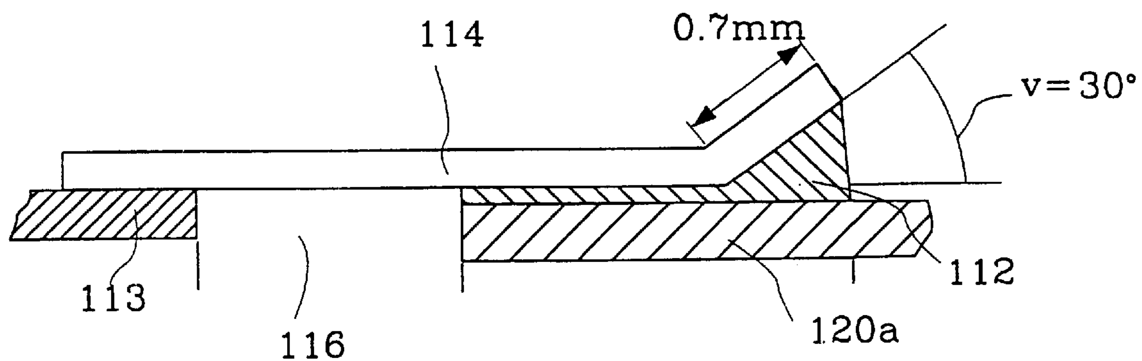
FIG. 2*a* shows a lateral view of a bent connection according to a first embodiment of the invention.

FIG. 2*a* shows a lateral view of a leg 114 which is bent at its free end according to a first embodiment of the invention. The same reference numerals as in FIGS. 1*a* and 1*b* are used. The figures are not to scale. In the present example, 0.7 mm of the end of the leg is bent at an angle ν of 30° . The soldered joint 112 in the present case is thicker under the bent part than under the unbent part of the leg.

When the bend is placed furthest out in the free end, the speed of an already initiated crack will be reduced as the joint becomes thicker.

Figure 2B:
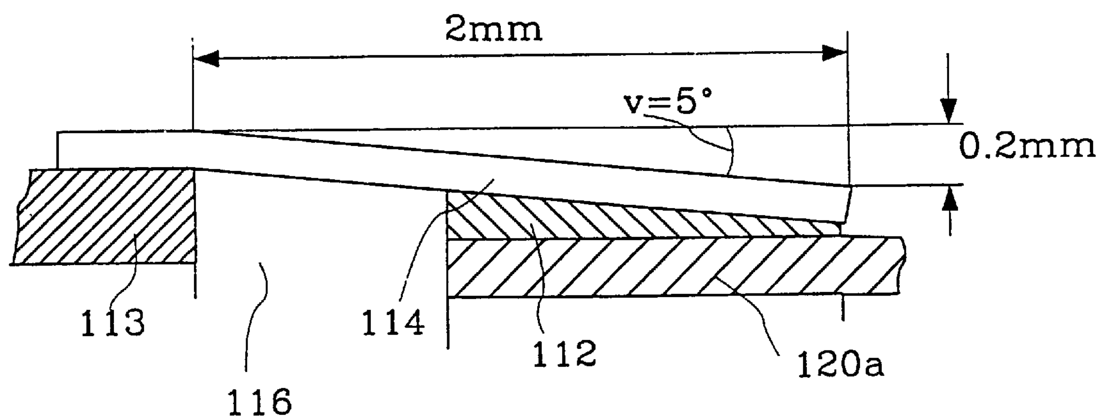
FIG. 2*b* shows a lateral view of a bent connection according to a second embodiment of the invention.

FIG. 2*b* shows a lateral view of a leg 114 which is bent at the end which is nearest to the transistor, according to a second embodiment of the invention. The same reference numerals as used in FIGS. 1*a* and 1*b* are used. The figure is not to scale. In the present case the transistor is somewhat raised in comparison with the circuit board surface, wherefore the bottom of the capsule 113 is drawn thicker than in FIG. 2*a*. During soldering of the leg, the leg is pressed towards the contact surface 120*a* of the conductors, whereby the leg 114 is bent at its fastening in the capsule 113 nearest to the transistor. In this way a tapering soldered joint 112 is obtained which is thickest nearest to the transistor.

The time for a crack to form depends, as mentioned earlier, on the thickness of the soldered joint. It therefore takes a longer time for a crack to initiate in a thicker soldered joint.

According to the embodiment which is illustrated in FIG. 2*b*, the transistor leg is 2 mm long and its displacement in the vertical direction after bending is 0.2 mm. This gives a bending angle ν which is approximately 5° .

It is naturally possible to bend the leg at other places, and depending on the length of the leg and how great a part of the leg which is bent, the angle of bending can be varied. For example, a tapering soldered joint, as in the previous example, can be obtained even if the leg is bent a bit out from the fastening to the transistor.

In all the above described embodiment the bending is made as large as it is permitted to be without the threshold value for the signal attenuation being surpassed.

If the legs should be both long and bent, the length and the bending of the leg must be adapted so that the predetermined threshold value is not surpassed.

It has been shown during tests that it is important that the contact surface of the legs against the soldered joint is homogeneous. If the legs should comprise cavities, the soldered joint breaks more quickly than if the legs were homogeneous. This is because a possible crack can wander up into a cavity, whereby the crack has a reduced distance to wander before the breakdown occurs.

The influence of the leg material was also tested and it was shown that legs of the alloy “Alloy42” gave a somewhat better durability to the connection arrangement than legs made of copper.

Experiments were performed where the connection arrangement according to the invention was compared to a conventional connection arrangement. The component legs were hereby made as long as possible without surpassing a predetermined value for the signal attenuation, i.e. the length was equal to the predetermined maximum length. The free ends of the legs were bent in accordance with the described embodiment in FIG. 2*a*. The legs were manufactured of the alloy “Alloy42”. The legs were soldered fast to contact plates by means of solder with the composition 25%Sn+62%Pb+3%Ag+10%Sb. Thereafter the connection arrangement was subject to temperature cycling, where the temperature was varied over a temperature interval of +5° C. to +130° C.

This temperature interval is considerably greater than the temperature interval which the soldered joint is expected to be subject to during operation. Such a large temperature interval was chosen in order to accelerate the fatigue. During normal operation it can take several years before a soldered joint breaks. The time for the soldered joint to deteriorate so much that its durability was considered unacceptable, was measured. The criteria for that the soldered joint had deteriorated so much that its durability was not considered to be acceptable, were: the appearance of cracks, or increase of the resistance by 10%, or grain enlargement occurring.

The result was compared to the result of the same test for the conventional connection arrangement, wherein the component legs were shorter and homogeneous and soldered to the foundation by means of the solder 62%Sn+36%Pb+2%Ag. The component legs in the present case were manufactured of “Alloy42” as this material is most common for such component legs.

The result of the comparison was that the connection arrangement according to the invention had approximately twice the length of life than a conventional connection arrangement.

The earlier mentioned solder 80%Au+20%Sn completely lacks grain growth and the length of life increases also with the use of this solder.

As is evident from the description, the connecting of the high-power component is influenced by a great number of factors. These factors have very different characters and influence, for example, the durability and signal quality. The inventive concept lies in realizing how important factors should be chosen and tested and how selected factors should be combined.

I claim:

1. A method for electrical connection of a high-power component to conductors on a circuit board, wherein the high-power component comprises electrically conducting conductors projecting over the circuit board, intended to be connected to the conductors by means of an electrically conducting fastening material, the high-power component is subject to repeated temperature changes, and the high-power component via the connections transmits electrical high-frequency signals to conductors, comprising the steps:

determining a threshold value for the highest permitted signal attenuation for the high-frequency electrical signals;

determining the maximum length which the connections can have without the threshold value being exceeded;

selecting a length of the projecting connections so that said maximum length is not exceeded;

producing connections with said selected length;

selecting a solder as an electrically conducting fastening material, the solder essentially lacks grain growth within a predetermined temperature interval;

connection of the connections to the conductors by soldering with said solder.

2. The method according the claim 1, further comprising selecting the length of the projecting connections so that they are as long as the maximum length permits.

3. The method according to claim 1, further comprising bending the connections so that they comprise at least one bent part which is shaped so that the threshold value of the signal attenuation is not exceeded.

4. The method according to claim 3, wherein the free ends of the connections comprise the bent parts.

5. The method according to claim 3, wherein the ends of the connections which project from the high-power component comprise the bent parts.

6. A method for electrical connection of a high-power component to conductors on a circuit board, wherein the high-power component comprises electrically conducting connections projecting over the circuit board, intended to be connected to the conductors by means of an electrically conducting fastening material, which the high-power component is subject to repeated temperature changes and which high-power component via the connections transmits electrical high-frequency signals to the conductors, comprising the steps:

determining a threshold value for the highest permitted signal attenuation for the high-frequency electrical signals;

shaping the contact surfaces of the connections so that they comprise at least one bent part, of which the bending is as large as can be permitted without the threshold value being exceeded;

selecting a solder as an electrically conducting fastening material, the solder essentially lacks grain growth within a predetermined temperature interval;

connecting the connections to the conductors by soldering with said solder.

7. The method according to claim 6, wherein the free ends of the connections comprise the bent parts.

8. The method according to claim 6, wherein the ends of the connections which project from the high-power component comprise the bent parts.

9. The method according to claim 6, further comprising determining the maximum length which the connections can have without the threshold value of the signal attenuation being exceeded;

selecting the length of the projecting connections so that said maximum length is not exceeded;

producing the connections with said selected length.

10. The method according the claim 9, further comprising selecting the length of the projecting connections so that they are as long as the maximum length permits.

11. The method according to claim 1, further comprising selecting an alloy containing 25%Sn+62%Pb+2%Ag+10%Sb as the solder.

12. The method according to claim 1, further comprising selecting an alloy containing 80%Au+20%Sn as the solder.

13. The method according to claim 1, wherein copper is selected as the material for the connections.

14. The method according to claim 1, wherein an alloy with the composition 42%Ni+58%Fe is selected as the material for the connections.

15. The method according to claim 1, wherein the high-power component is a high-power transistor.

16. A connection arrangement for electrical connection of a high-power component to conductors on a circuit board, comprising:

electrically conducting connections projecting over the circuit board from the high-power component and intended to be connected to the conductors;

an electrically conducting fastening material which joins the respective connections with the conductors;

the high-power component is subject to repeated temperature changes and the high-power component, via the connections, transmits electrical high-frequency signals to the conductors, the electrical high-frequency signals being attenuated by the connections as the signal passes from the high-power component through the connections;

the electrically conducting fastening material is a solder which essentially lacks grain growth within a predetermined temperature interval on the order of a 125° C. range, and;

the connections having a length which does not exceed the maximum length which can be used without causing attenuation of the signals to such an extent that a predetermined highest threshold signal attenuation of the electrical high-frequency signals is exceeded.

17. The connection arrangement according to claim 16, wherein the length of the connections equals the maximum length.

18. The connection arrangement according to claim 16, wherein the contact surfaces of the connections are so shaped that they comprise at least one bent part forming a bend angle, the bent part causing attenuation of the signals, the bend angle is as large as can be permitted without the threshold value being exceeded.

19. The connection arrangement according to claim 18, wherein the free ends of the connections form the bent parts.

20. The connection arrangement according to claim 18, wherein the ends of the connections which project from the high-power component comprise the bent parts.

21. A connection arrangement for electrical connection of a high-power component to conductors on a circuit board, comprising:

electrically conducting connections projecting over the circuit board from the high-power component and intended to be connected to the conductors;

an electrically conducting fastening material which joins the respective connections with the conductors;

the high-power component is subject to repeated temperature changes and the high-power component, via the connections, transmits electrical high-frequency signals to the conductors, the electrical high-frequency signals being attenuated by the connections as the signal passes from the high-power component through the connections, the electrically conducting fastening material is a solder which essentially lacks grain growth within a predeternined temperature interval on the order of a 125° C. range; and the contact surfaces of the connections are shaped so that they comprise at least one bent part forming a bend angle, the bent part causing attenuation of the signals, the bend angle is as large as can be permitted without a predetermined highest signal attenuation of the electrical high-frequency signal being exceeded.

22. The connecting arrangement according to claim 21, wherein the free ends of the connections form the bent parts.

23. The connection arrangement according to claim 21, wherein the ends of the connections which project from the high-power component form the bent parts.

24. The connection arrangement according to claim 21, wherein the connections have a length that does not exceed the maximum length which can be used without causing attenuation of the signals to such an extent that a predetermined highest signal attenuation of the electrical high-frequency signal is exceeded.

25. The connection arrangement according to claim 24, wherein the length of the connections equals the maximum length.

26. The connection arrangement according to claim 16, wherein the connections are manufactured from copper.

27. The connection arrangement according to claim 16, wherein the connections are manufactured from an alloy with the composition 42%Ni+58%Fe.

28. The connection arrangement according to claim 16, wherein the high-power component is a high-power transistor.

29. The connection arrangement according to claim 16, wherein the temperature interval ranges from approximately +5° C. to +130° C.

30. The connection arrangement according to claim 21, wherein the temperature interval ranges from approximately +5° C. to +130° C.

31. The connection arrangement of claim 16, wherein the predetermined highest signal attenuation is 0.5 dB.

32. The connection arrangement of claim 21, wherein the predetermined highest signal attenuation is 0.5 dB.

33. A connection arrangement for electrical connection of a high-power component to conductors on a circuit board comprising:

electrically conducting connections projecting over the circuit board from the high-power component and intended to be connected to the conductors;

an electrically conducting fastening material which joins the respective connections with the conductors;

the high-power component is subjected to repeated temperature changes, and the high power component, via the connections, transmits electrical high-frequency signals to the conductors, the electrical high-frequency signals being attenuated by the connections as the signal passes from the high-power component through the connections;

the electrically conducting fastening material is a solder which essentially lacks grain growth within a predetermined temperature interval which is on the order of a 125° C. range; and the connections having a length which equals the maximum length which can be used without causing attenuation of the signals to such an extent that a predetermined highest signal attenuation level of the signals is exceeded.

34. A connection arrangement for electrical connection of a high-power component to conductors on a circuit board comprising:

electrically conducting connections projecting over the circuit board from the high-power component and intended to be connected to the conductors;

an electrically conducting fastening material which joins the respective connections with the conductors;

the high-power component is subjected to repeated temperature changes, and the high power component, via the connections, transmits electrical high-frequency signals to the conductors, the electrical high-frequency signals being attenuated by the connections as the signal passes from the high-power component through the connections;

the electrically conducting fastening material is a solder which essentially lacks grain growth within a predetermined temperature interval which is on the order of a 125° C. range;

the connections having a length which does not exceed the maximum length which can be used without causing attenuation of the signals to such an extent that a predetermined highest signal attenuation level of the signals is exceeded; and the connections having at least one contact surface shaped to form at least one bent part forming a bend angle, the bent part causing attenuation of the signals, the bend angle is as large as can be permitted without the threshold value being exceeded.

35. A connection arrangement for electrical connection of a high-power component to conductors on a circuit board comprising:

electrically conducting connections projecting over the circuit board from the high-power component and intended to be connected to the conductors;

an electrically conducting fastening material which joins the respective connections with the conductors;

the high-power component is subjected to repeated temperature changes, and the high power component, via the connections, transmits electrical high-frequency signals to the conductors, the electrical high-frequency signals being attenuated by the connections as the signal passes from the high-power component through the connections;

the electrically conducting fastening material is a solder which essentially lacks grain growth within a predetermined temperature interval which is on the order of a 125° C. range;

the connectors have contact surfaces that are shaped so that they comprise at least one bent part forming a bend angle, the bent part causing attenuation of the signals, the bend angle is as large as can be permitted without the threshold value being exceeded; and the connectors having free ends, the bent parts being located at the free ends of the connectors.

36. A connection arrangement for electrical connection of a high-power component to conductors on a circuit board comprising:

electrically conducting connections projecting over the circuit board from the high-power component and intended to be connected to the conductors;

an electrically conducting fastening material which joins the respective connections with the conductors;

the high-power component is subjected to repeated temperature changes, and the high power component, via the connections, transmits electrical high-frequency signals to the conductors, the electrical high-frequency signals being attenuated by the connections as the signal passes from the high-power component through the connections;

the electrically conducting fastening material is a solder which essentially lacks grain growth within a predetermined temperature interval which is on the order of a 125° C. range;

the connectors have contact surfaces that are shaped so that they comprise at least one bent part forming a bend angle, the bent part causing attenuation of the signals, the bend angle is as large as can be permitted without the threshold value being exceeded; and the connectors have ends that project from the high-power component and which comprise the at least one bent part.

37. A connection arrangement for electrical connection of a high-power component to conductors on a circuit board comprising:

electrically conducting connections projecting over the circuit board from the high-power component and intended to be connected to the conductors;

an electrically conducting fastening material which joins the respective connections with the conductors;

the high-power component is subjected to repeated temperature changes, and the high power component, via the connections, transmits electrical high-frequency signals to the conductors, the electrical high-frequency signals being attenuated by the connections as the signal passes from the high-power component through the connections;

the electrically conducting fastening material is a solder which essentially lacks grain growth within a predetermined temperature interval which is on the order of a 125° C. range;

the connectors have contact surfaces that are shaped so that they comprise at least one bent part forming a bend angle, the bent part causing attenuation of the signals, the bend angle is as large as can be permitted without the threshold value being exceeded; and the connections having a length which does not exceed the maximum length which can be used without causing attenuation of the signals to such an extent that a predetermined highest signal attenuation level of the signals is exceeded.

* * * * *